(12) United States Patent
Platz et al.

(10) Patent No.: US 9,244,650 B2
(45) Date of Patent: Jan. 26, 2016

(54) POST-DRIVE SUMMARY WITH TUTORIAL

(71) Applicant: Microsoft Corporation, Redmond, WA (US)

(72) Inventors: Cheryl N. Platz, Redmond, WA (US);
John P. Hendricks, Redmond, WA (US);
Mark O'Hanlon, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 29 days.

(21) Appl. No.: 14/156,407

(22) Filed: Jan. 15, 2014

(65) Prior Publication Data

US 2015/0199162 A1    Jul. 16, 2015

(51) Int. Cl.
*G06F 17/00* (2006.01)
*G06F 3/147* (2006.01)
*G06F 3/041* (2006.01)
*G08G 1/01* (2006.01)
*G08G 1/0962* (2006.01)
*G08G 1/00* (2006.01)
*B60Q 1/00* (2006.01)
*H05K 7/20* (2006.01)
*G01M 17/00* (2006.01)
(Continued)

(52) U.S. Cl.
CPC .............. *G06F 3/147* (2013.01); *G06F 3/0412* (2013.01); *G08G 1/0112* (2013.01); *G08G 1/0129* (2013.01); *G08G 1/09626* (2013.01); *B60L 11/123* (2013.01); *B60Q 1/00* (2013.01); *B60R 25/00* (2013.01); *G01M 17/00* (2013.01); *G06F 19/00* (2013.01); *G06Q 10/00* (2013.01); *G08G 1/00* (2013.01); *H05K 7/20209* (2013.01)

(58) Field of Classification Search
CPC ............ G08G 1/00; B60Q 1/00; G06F 3/147;
G06F 3/0412; G06F 19/00; G06F 7/00;
G06F 17/00; H05K 7/20209; G01M 17/00;
B60L 11/123; G06Q 10/00; G06Q 40/00;
H04W 12/08; B60R 25/00; G01C 21/00;
G01C 21/34; G05D 1/00
See application file for complete search history.

(56) References Cited

U.S. PATENT DOCUMENTS 5,757,268 A    5/1998   Toffolo et al.
5,819,201 A   10/1998   DeGraaf
(Continued)

FOREIGN PATENT DOCUMENTS

EP            2161697 A1    3/2010

OTHER PUBLICATIONS

Toledo, et al., "In-Vehicle Data Recorder for Evaluation of Driving Behavior and Safety", in Journal of the Transportation Research Board, No. 1953, Transportation Research Board of the National Academies, Washington, D.C., 2006, pp. 112-119.
(Continued)

*Primary Examiner* — Behrang Badii
(74) *Attorney, Agent, or Firm* — John Jardine; Judy Yee; Micky Minhas

(57) ABSTRACT

Aspects of the subject matter described herein relate to vehicle notifications. In aspects, while a vehicle is in motion, certain types of notifications are not presented to the driver. After the vehicle has stopped and a point appropriate for notification is occurring, a notification may be presented. The notification may assist a driver in, for example, learning features of the vehicle, improving efficiency, or in many other ways.

20 Claims, 7 Drawing Sheets

(51) Int. Cl.
  *G06F 19/00* (2011.01)
  *B60L 11/12* (2006.01)
  *B60R 25/00* (2013.01)
  *G06Q 10/00* (2012.01)

(56) References Cited

U.S. PATENT DOCUMENTS

| | | |
|---|---|---|
| 6,256,577 B1 | 7/2001 | Graunke |
| 6,330,499 B1 | 12/2001 | Chou et al. |
| 6,411,891 B1* | 6/2002 | Jones ............... G06Q 10/08 342/357.395 |
| 7,639,148 B2 | 12/2009 | Victor |
| 2006/0055564 A1 | 3/2006 | Olsen et al. |
| 2006/0089787 A1 | 4/2006 | Burr et al. |
| 2006/0265126 A1 | 11/2006 | Olcott |
| 2007/0225902 A1 | 9/2007 | Gretton et al. |
| 2008/0004793 A1 | 1/2008 | Horvitz et al. |
| 2009/0210257 A1 | 8/2009 | Chalfant et al. |
| 2010/0088163 A1 | 4/2010 | Davidson et al. |
| 2010/0256861 A1 | 10/2010 | Hodges |
| 2011/0193721 A1* | 8/2011 | Koie ............... B60R 25/00 340/901 |
| 2012/0029759 A1 | 2/2012 | Suh et al. |
| 2012/0029801 A1 | 2/2012 | Yano et al. |
| 2012/0179346 A1 | 7/2012 | Aldighieri et al. |
| 2012/0191343 A1 | 7/2012 | Haleem |
| 2013/0110310 A1 | 5/2013 | Young |
| 2013/0143528 A1 | 6/2013 | Randazzo et al. |
| 2013/0158873 A1 | 6/2013 | Rhee et al. |
| 2013/0268148 A1* | 10/2013 | Kondo ............... B60N 5/00 701/19 |
| 2013/0311041 A1 | 11/2013 | Lynar et al. |

OTHER PUBLICATIONS

"Automatic", Retrieved at <<http://www.automatic.com>>, Retrieved date: Oct. 25, 2013, 4 pages.

International Search Report and Written Opinion of the International Searching Authority regarding Application No. PCT/US2015/010710 mailed Apr. 13, 2015, 13 pages.

\* cited by examiner

_US 9,244,650 B2_

POST-DRIVE SUMMARY WITH TUTORIAL

BACKGROUND

Increasingly, computer-like features and user interfaces are finding their way into automobiles. Where once a car had a set of analog gauges located on a dashboard, newer cars often have digital gauges and may also have a display that displays mapping information, backup video, trip statistics, audio data, computer applications, and the like. The feature set of the user-interface for an automobile may include a plethora of options. While these options may be detailed in a lengthy automobile owner's manual and perhaps other documentation, many owners do not read these materials.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

Briefly, aspects of the subject matter described herein relate to vehicle notifications. In aspects, while a vehicle is in motion, certain types of notifications are not presented to the driver. After the vehicle has stopped and a point appropriate for notification is occurring, a notification may be presented. The notification may assist a driver in, for example, learning features of the vehicle, improving efficiency, or in many other ways.

This Summary is provided to briefly identify some aspects of the subject matter that is further described below in the Detailed Description. This Summary is not intended to identify key or essential features of the claimed subject matter, nor is it intended to be used to limit the scope of the claimed subject matter.

The phrase "subject matter described herein" refers to subject matter described in the Detailed Description unless the context clearly indicates otherwise. The term "aspects" should be read as "at least one aspect." Identifying aspects of the subject matter described in the Detailed Description is not intended to identify key or essential features of the claimed subject matter.

The aspects described above and other aspects of the subject matter described herein are illustrated by way of example and not limited in the accompanying figures in which like reference numerals indicate similar elements and in which:

DETAILED DESCRIPTION

Definitions

As used herein, the term "includes" and its variants are to be read as open-ended terms that mean "includes, but is not limited to." The term "or" is to be read as "and/or" unless the context clearly dictates otherwise. The term "based on" is to be read as "based at least in part on." The terms "one embodiment" and "an embodiment" are to be read as "at least one embodiment." The term "another embodiment" is to be read as "at least one other embodiment."

As used herein, terms such as "a," "an," and "the" are inclusive of one or more of the indicated item or action. In particular, in the claims a reference to an item generally means at least one such item is present and a reference to an action means at least one instance of the action is performed.

The term data is to be read broadly to include anything that may be represented by one or more computer storage elements. Logically, data may be represented as a series of 1's and 0's in volatile or non-volatile memory. In computers that have a non-binary storage medium, data may be represented according to the capabilities of the storage medium. Data may be organized into different types of data structures including simple data types such as numbers, letters, and the like, hierarchical, linked, or other related data types, data structures that include multiple other data structures or simple data types, and the like. Some examples of data include information, program state, program data, other data, and the like.

Headings are for convenience only; information on a given topic may be found outside the section whose heading indicates that topic.

Other definitions, explicit and implicit, may be included below.

Exemplary Operating Environment

Figure 1:
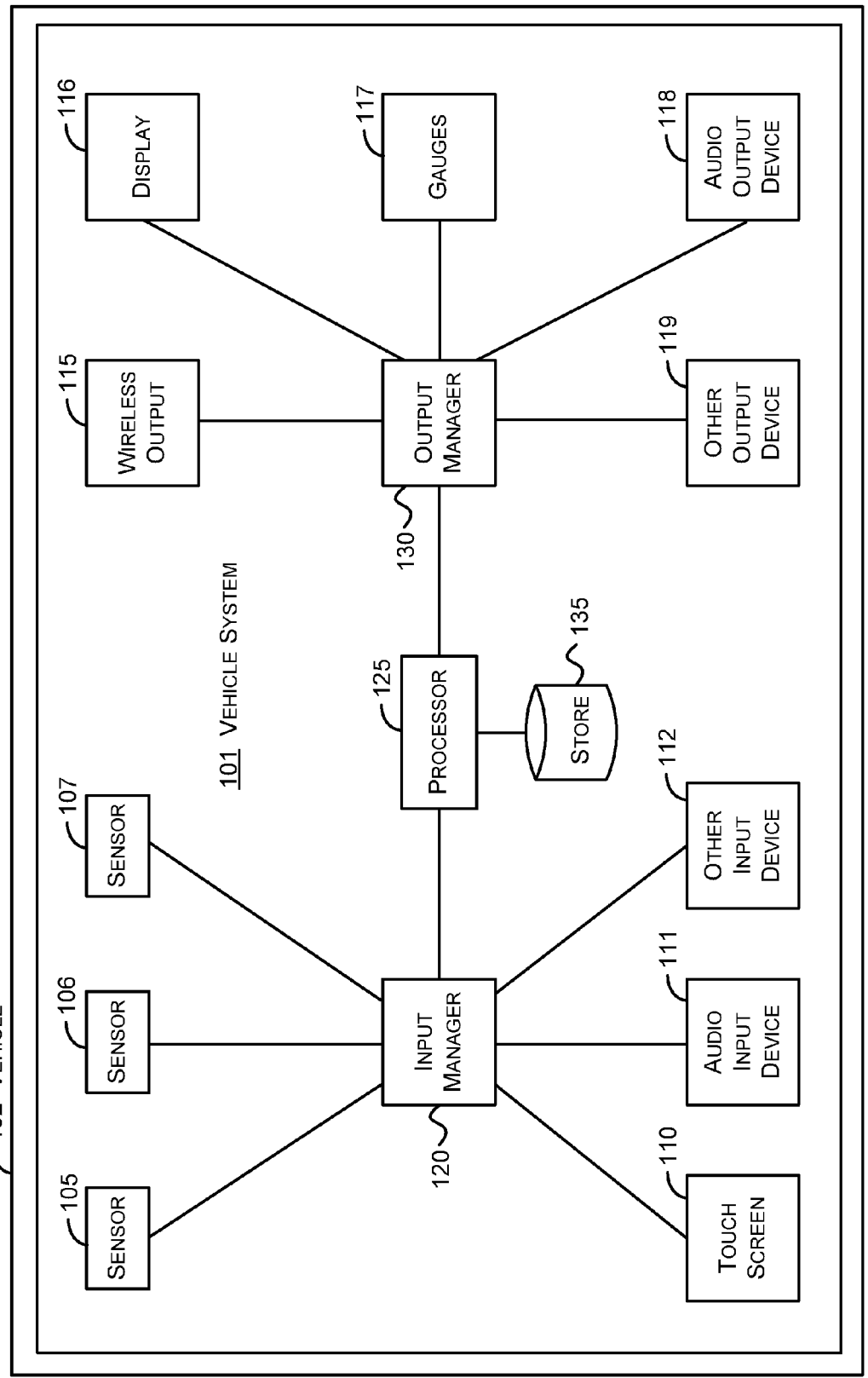
FIG. 1 is a block diagram representing an exemplary computing environment into which aspects of the subject matter described herein may be incorporated.

FIG. 1 illustrates an example of a suitable environment 100 in which aspects of the subject matter described herein may be implemented. The environment 100 is only one example of a suitable environment and is not intended to suggest any limitation as to the scope, use, or functionality of aspects of the subject matter described herein. Neither should the environment 100 be interpreted as having any dependency or requirement relating to any one or combination of components illustrated in the exemplary environment 100.

Furthermore, while various examples are illustrated in the figures and described in the text herein, there is no intention that the examples given are all-inclusive or exhaustive. Indeed, based on the teachings herein, those skilled in the art may recognize many other examples that may properly be used without departing from the spirit or scope of aspects of the subject matter described herein.

Illustrated in FIG. 1 is a vehicle 102. The vehicle 102 may include, for example, a car, van, truck, motorcycle, boat, tractor, harvester, other vehicle, or the like. The vehicle 102 may include a vehicle system 101. The vehicle system 101 may include exemplary components such as the sensors 105-107, the inputs 110-112, the outputs 115-119, the input manager 120, the processor 125, the output manager 130, other components (not shown), and the like.

The components illustrated in FIG. 1 are exemplary and are not meant to be all-inclusive of components that may be needed or included. Furthermore, the number of components may differ in other embodiments without departing from the spirit or scope of aspects of the subject matter described herein. In some embodiments, the components described in conjunction with FIG. 1 may be included in other components (shown or not shown) or placed in subcomponents without departing from the spirit or scope of aspects of the subject matter described herein. In some embodiments, the components and/or functions described in conjunction with FIG. 1 may be distributed across multiple devices.

As used herein, the term component may be read in alternate implementations to include hardware such as all or a portion of a device, a collection of one or more software modules or portions thereof, some combination of one or more software modules or portions thereof and one or more devices or portions thereof, or the like. In one implementation, a component may be implemented by structuring (e.g., programming) a processor to perform one or more actions.

Figure 2:
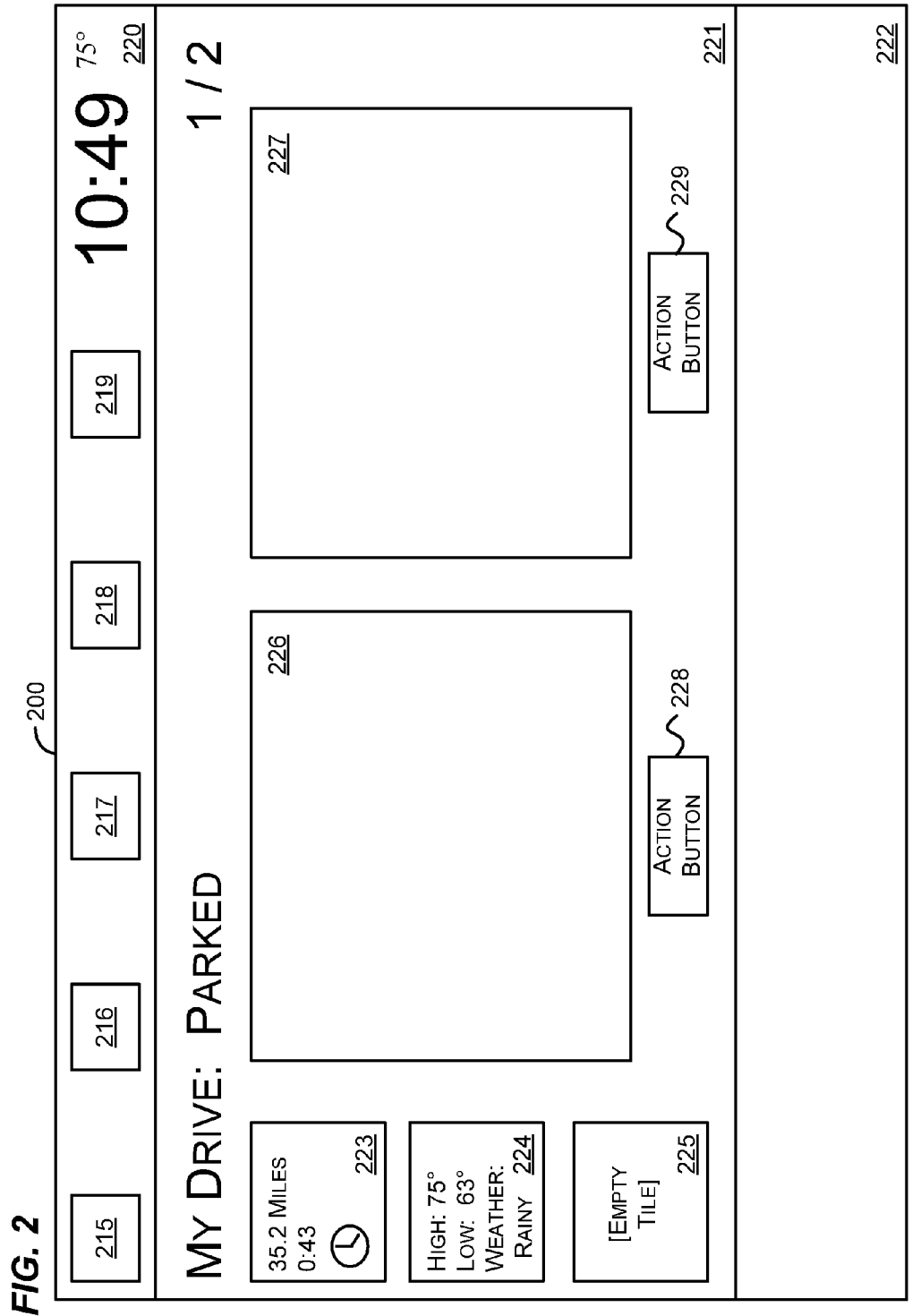
FIGS. 2-6 are block diagrams of exemplary display pages in accordance with aspects of the subject matter described herein.

One or more of the components illustrated in FIG. 2 may be implemented using one or more computing devices or portions thereof. Such devices may include, for example, personal computers, server computers, hand-held or laptop devices, multiprocessor systems, microcontroller-based systems, set-top boxes, programmable consumer electronics, network PCs, minicomputers, mainframe computers, cell phones, personal digital assistants (PDAs), gaming devices, printers, appliances including set-top, media center, or other appliances, automobile-embedded or attached computing devices, other mobile devices, distributed computing environments that include any of the above systems or devices, and the like.

Aspects of the subject matter described herein may be described in the context of computer-executable instructions, such as program modules, being executed by a computer. Generally, program modules include routines, programs, objects, components, data structures, and so forth, which perform particular tasks or implement particular abstract data types. Aspects of the subject matter described herein may also be practiced in distributed computing environments where tasks are performed by remote processing devices that are linked through a communications network. In a distributed computing environment, program modules may be located in both local and remote computer storage media including memory storage devices.

Alternatively, or in addition, the functionality described herein may be performed, at least in part, by one or more hardware logic components. For example, and without limitation, illustrative types of hardware logic components that can be used include Field-programmable Gate Arrays (FPGAs), Program-specific Integrated Circuits (ASICs), Application-specific Standard Products (ASSPs), System-on-a-chip systems (SOCs), Complex Programmable Logic Devices (CPLDs), and the like.

With reference to FIG. 1, the processor 125 may be coupled to an input manager 120 and an output manager 130. The input manager 120 may receive input from the sensors 105-107, the touch screen 110, the audio input device 111, and the other input device 112. Likewise, the output manager 130 may provide output to the wireless output 115, the display 116, the gauges 117, the audio output device 118, the other output device 119, and the like. In one implementation, the display 116 and the touch screen 110 may be implemented on the same device. Note that although as illustrated there are certain numbers of sensors, input devices, and output devices, it is to be understood that any practical number may be in a given vehicle system, and that there may be different numbers of sensors, input devices and/or output devices in a given vehicle system.

In general, the sensors 105-107 sense characteristics regarding the environment 100 (which may include people, things, and conditions inside the vehicle 102 as well as people, things, and conditions outside the vehicle 102). In general, a sensor may include any device that is capable of detecting a characteristic of something—including, for example, occupants, environmental or other conditions, items, or the like inside or outside of the vehicle 102. Exemplary sensors include photocells, cameras, microphones, GPSs, gyroscopes, galvanic skin response strips, cameras, temperature sensors, velocity sensors, motion sensors, humidity sensors, and the like.

The touch screen 110 may provide data to the input manager 120 regarding user interactions with a display device in the vehicle 102. The audio input device 111 may provide data corresponding to audio detected by a microphone that is meant to capture sound, such as sound from an occupant of the vehicle 102.

Based on the teachings herein, those skilled in the art may recognize other input devices that may be used to provide input data to the input manager 120 without departing from the spirit or scope of aspects of the subject matter described herein. Some examples of other input devices include steering wheels, haptic controls, jog dials, keyboards, mice, storage devices (e.g., a USB drive), cameras, wireless devices, and the like.

The wireless output 115 may provide a wireless signal to any device that uses a wireless signals to communicate. The wireless output 115 may include, for example, an antenna that transmits and receives signals from such wireless devices.

The display 116 may display graphical information to an occupant of the vehicle. In one implementation, the display 116 may be touch-sensitive so that it may also receive user input. In another implementation, the display 116 may not be touch-sensitive.

The gauges 117 may show the status of various components of the vehicle 102. In one implementation, one or more of the gauges 117 may be integrated with the display 116 such that the information of the one or more gauges is displayed via the display 116.

The audio output device 118 may provide audio. The audio may include user-requested audio (e.g., something that a user has requested be played on an audio system of the vehicle 102) as well as instructions, information, entertainment, or the like provided by the vehicle system 101.

The store 135 may include any type of computer storage media. Computer storage media includes both volatile and nonvolatile, removable and non-removable media implemented in any method, article of manufacture, or technology for storage of information such as computer-readable instructions, data structures, program modules, or other data. Computer storage media includes RAM, ROM, EEPROM, solid state storage, flash memory or other memory technology, CD-ROM, digital versatile discs (DVDs) or other optical disk storage, magnetic cassettes, magnetic tape, magnetic disk storage or other magnetic storage devices, or any other medium which can be used to store the desired information and which can be accessed by the processor 125. Computer storage media does not include communication media.

Communication media typically embodies computer-readable instructions, data structures, program modules, or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct wired connection, and wireless media such as acoustic, RF, infrared and other wireless media.

A person may interact with the vehicle system 101 through various input devices of the vehicle system 101. Some exemplary input devices have been described above. Other exemplary input devices (not shown) may include a joystick, game pad, scanner, a writing tablet, a pointing device (e.g. including a mouse, trackball, touch pad, or the like), or the like.

Through the use of one or more of the above-identified input devices a Natural User Interface (NUI) may be established. A NUI, may rely on speech recognition, touch and stylus recognition, gesture recognition both on screen and adjacent to the screen, air or other gestures, head and eye tracking, voice and speech, vision, touch, machine intelligence, and the like. Some exemplary NUI technology that may be employed to interact with a user include touch sensitive displays, voice and speech recognition, intention and goal understanding, galvanic skin response strips, particle/molecular detection systems, motion gesture detection using depth cameras (such as stereoscopic camera systems, infrared camera systems, RGB camera systems, and combinations thereof), motion gesture detection using accelerometers/gyroscopes, facial recognition, 3D displays, head, eye, and gaze tracking, immersive augmented reality and virtual reality systems, as well as technologies for sensing brain activity using electric field sensing electrodes (EEG and related methods).

The vehicle system 101 may operate in a networked environment using logical connections to one or more remote devices. Logical connections may include a local area network (LAN), a wide area network (WAN), a phone network, near field networks, other networks, and the like.

For ease in presentation, the term "driver" is often used herein to refer to the person driving the vehicle. In alternative implementations, the teachings provided herein as applying to a driver may also apply to other individuals who are not driving the vehicle. Some exemplary individuals may include passengers in the vehicle, relatives or friends of the driver, people who service or clean the vehicle, emergency or law-enforcement people who interact with the vehicle, other people, and the like.

As a vehicle may have different drivers at different times, the vehicle system 101 may include an identity component that is able to identify the driver and other occupants of the vehicle 102. To detect that multiple occupants are in the vehicle 102, the vehicle system 101 may, for example, include sensors that detect weight in each of the seats of the vehicle and/or whether seatbelts have been buckled, cameras that visually detect the occupants, other types of sensors, or the like.

In an implementation, the vehicle system 101 may be structured (e.g., via instructions in hardware, firmware, and/or software available to the processor 125) to display certain information while the vehicle 102 is in motion and other information when the vehicle 102 is stopped and is at a point appropriate for notification. For example, the processor 125 may be structured to create a circuit by loading instructions and executing them. The circuit may be responsive to a sensor detecting that the vehicle has stopped. The processor may be further structured (e.g., by executing additional instructions) to determine whether the vehicle is at a point appropriate for presenting a notification to the individual.

In one implementation, the vehicle system 101 may be configured to refrain from presenting all but emergency notifications (e.g., notifications about issues that may affect the safety of the vehicle or occupants), status (e.g., gauge like) notifications, and the like while the vehicle is in motion. Some examples of different information that may be displayed are illustrated in FIGS. 2-6.

In an implementation, the vehicle system 101 may be configured to present some types of notifications even when the vehicle is in motion. For example, in a vehicle in which driving is automated, there may be no or few restrictions as to what notifications may be displayed. As another example, various notifications may be provided to backseat occupants of a vehicle. As another example, other notifications mentioned herein may be displayed while the vehicle is in motion if a point appropriate for displaying the notifications is occurring.

In an implementation, while a vehicle is stopped, the vehicle being stopped may not by itself be sufficient to justify displaying a non-critical notification. For example, a vehicle may be temporarily stopped at a stop light where displaying a notification may distract the driver. As another example, the vehicle may temporarily stop in slow traffic. Determining whether the vehicle is at a stopping point appropriate for notification may include checking to see whether one or more conditions (in addition to the vehicle being stopped) are satisfied.

For example, in one implementation, a function that includes one or more of the factors below with a weight for each of the included factors may be used to generate a value. If the value is above a configurable or fixed threshold, the vehicle system 101 may determine that a point appropriate for notification is occurring. In another implementation, a rules-based system may be used to determine that a point appropriate for notification is occurring. In another implementation, a hybrid process that uses a function and rules may be used to determine that a point appropriate for notification is occurring.

Some exemplary conditions include:

1. How long the vehicle has been stopped. For example, if a vehicle has been stopped over X seconds (where X is configurable, tunable, or fixed), this may be factor in determining whether notification is appropriate.

2. Whether the vehicle has been turned off or is in another power state. When a vehicle has been turned off or is in another power state, this may be a strong indicator that the driver is done driving the vehicle at least for a while. When the vehicle is turned off or is in another power state, the vehicle system 101 may use this as a factor in determining whether notification is appropriate.

3. Whether the vehicle has been placed in park. A vehicle is often placed in park just before the vehicle is turned off. The vehicle system 101 may use this as a factor in determining whether notification is appropriate.

4. How long the vehicle has been in park. For example, if a vehicle has been in park for over X seconds (where X is configurable, tunable, or fixed), this may be factor in determining whether notification is appropriate.

5. Where the vehicle is located. If the vehicle is parked in the driver's garage, this may be used as a factor in determining that an appropriate notification point is occurring.

6. What time it is. For example, if the vehicle is located at home after 5:00 p.m., this may be sufficient to determine that an appropriate notification point is occurring. As another example, if the time is the approximate time that the driver stops driving the car and the car is located at home, this may be sufficient to determine that an appropriate notification point is occurring.

7. Proximity to friends. For example, if the vehicle is located next to a friend, this may be deemed an inappropriate time to provide a notification as the driver may want to interact with the friend.

8. Data specific to people who live in a region. For example, people who live in a region may be more receptive to notifications at the end of the day at home instead of notifications while stopping at a coffee shop.

9. Whether the vehicle typically spends a lot of time at the location. For example, many commuter vehicles spend a lot of time at home and at work. That the vehicle is stopped at a place where the vehicle typically spends a lot of time may be used as a factor in determining that a point appropriate for notification is occurring.

10. What type of vehicle the vehicle is. For example, for youth-oriented vehicles, when the vehicle is shifted into park, this may be used as a factor in determining that a point appropriate for notification point is occurring. As another example, for luxury vehicles, when the vehicle is actually turned off may be a more significant factor than when the vehicle is shifted into park in determining that a point appropriate for notification point is occurring.

11. Historical data regarding a location. For example, historical data may indicate that vehicles remain stopped at certain locations (e.g., ferry terminals or other locations), for a long time. When the vehicle stops at such a location, this may be used as a factor in determining that a point appropriate for notification is occurring.

As mentioned previously, a modern car that includes a vehicle system like the vehicle system 101 may have many features. Without help, the driver may not become aware of these features or may have issues using these features. For example, some issues include: issues using brought-in devices, issues using a core feature of the vehicle system, vehicle system use optimization suggestions (how to better use the vehicle system), issues using a software application of the vehicle system, optimization suggestions for a software application, verbose system notifications (e.g. extrapolating a check engine light into specific notifications and guidance), and the like. By monitoring driver behavior, the vehicle system 101 may be able to provide helpful hints to the driver. These hints may be provided at the point determined above. For example:

1. A driver may have issues pairing a cell phone or other device (e.g., headset, tablet, laptop, GPS, or other device) with the vehicle system 101. In conjunction with recognizing this issue, the vehicle system 101 may determine that an update is available that addresses pairing issues between the driver's cell phone or other device and the vehicle system 101. In response, the vehicle system 101 may notify the driver that an update has been received that addresses pairing issues and may provide a button for downloading and installing the update.

2. A driver may use the vehicle system 101 to search for local places, but may not use the vehicle system 101 to search for media or local events. The vehicle system 101 may observe this behavior and may notify the driver of this unused feature that is similar or equivalent to what the driver already does.

3. A driver may not take advantage of available shortcuts. For example, a driver may navigate through a series of on-screen menus to select a destination for a mapping system. The same goal (e.g., of selecting the destination) may be achieved through a much faster input mechanism (e.g., via a voice command). The vehicle system 101 may observe the behavior of using the cumbersome method and may notify the driver of the shortcut.

4. A driver may not take advantage of fuel-saving features of a vehicle. For example, when driving at freeway speeds, the driver may keep the vehicle a gear that is less optimal for fuel economy. For example, the driver may keep the vehicle in drive gear even though the vehicle may have an overdrive gear that is more fuel economical for driving at freeway speeds. The vehicle system 101 may observe this behavior and based on its knowledge of the capabilities of the vehicle 102 may notify the driver of the overdrive gear, how the overdrive gear may be selected, and the benefits of using the overdrive gear for fuel economy while driving at freeway speeds.

5. A driver may frequently listen to the radio. The vehicle system 101 may observe this behavior and may notify the driver of an application, free or paid, that may be downloaded and installed to provide a better listening experience.

6. A driver may often use touch mechanisms to tune a radio to a certain station. The vehicle system 101 may observe this behavior and may notify the driver of speech option equivalents that allow the driver to accomplish the same goal easier and faster and without compromising safety. For example, the vehicle system 101 may provide a notification that indicates, "Say FM 89.5" to cause the radio to tune to 89.5.

7. A driver may use two or more separate manual controls to cause a vehicle to defrost various elements (e.g., windows and mirrors) of the vehicle 102. The vehicle system 101 may observe this behavior and may notify the driver of a speech option equivalent (e.g., "Say defrost all") that allows the driver to accomplish the same goal.

8. A driver may use favorites (e.g., presets) for a radio but may not use favorites in other scenarios. For example, the driver may frequently navigate a contacts list to call the same group of people. The vehicle system 101 may observe this behavior and may notify the driver of a capability of setting favorites (e.g., pinning contact UI elements to a call screen) to accomplish the same goal.

As another example, a driver may not use favorites for navigation. The system 101 may observe this behavior and may notify the driver of a capability of setting favorites (e.g., pinning location UI elements to a navigation screen) to accomplish the same goal.

9. A driver may be unfamiliar with different ways of interacting with applications of the vehicle system 101. For example, the driver may not use "Go to location" or "stop at location" voice commands to instruct a mapping system. As another example, a driver may not be aware of gestures or other user input that can be used to navigate a user interface. A driver may not be aware of calendar features, or new applications that are available, of how to use home page widgets, or the like. In response, the vehicle system 101 may observe that the driver does not interact with the vehicle system 101 in these ways and may provide tips that teach the driver of these features.

10. The driver may be notified of new applications and updates for existing applications for applications that are available via the vehicle system 101. The driver may be provided with a menu that allows the driver to view applications that are currently installed on the vehicle system 101 as well as applications that are available to download to the vehicle system 101.

Aspects of the subject matter described herein may be used to influence driver behavior through gamification. In gamification, the driving system 101 attempts to introduce concepts of a game (e.g., scoring points, reaching objectives, competition, and the like) to improve driver behavior. For example:

1. The driver may be informed how the driver's efficiency compares to the efficiency of a friend and indicate what may be done to improve efficiency.

2. The driver may be informed specifically how the driver's most previous acceleration reduced fuel economy.

3. The driver may be informed that a safety score dropped because of how close the driver was following other vehicles. The driver may be further informed about how this may adversely affect the driver's vehicle insurance in specific terms.

4. A driver may take various routes to work. The driving system 101 may notice that different routes are taken to work and may determine how efficient each route is. A notification about the average efficiency of each route may be provided to the driver.

5. A vehicle may be provided by a ride sharing organization where different people drive the vehicle at different times. With measurements provided by the driving system 101, the organization may reward drivers using gamification.

The vehicle system 101 may observe a driver's response to notifications and use this observation to guide subsequent notifications. Some examples of this include:

1. If the vehicle system 101 observes that a driver is receptive to tips about how to improve fuel efficiency for the vehicle 102, the vehicle system 101 may increasingly provide such tips.

2. If the vehicle system 101 observes that a driver is more receptive to notifications about new applications that are available, the vehicle system 101 may increasingly provide such notifications.

The vehicle system 101 may present or refrain from presenting notifications based on the number and/or identity of people who are in the vehicle 102. Some examples of this include:

1. Not displaying potentially personal information.
2. Presenting notification of coupons, deals, or activities suitable for the number and/or identities of the people in the vehicle 102.

The vehicle system 101 may generate multiple notifications for presentation to a driver. To avoid overloading the driver with information, the number of notifications that may be presented at one time may be limited to a configurable number. With multiple notifications available to present, what notifications to display may be prioritized by the processor 125 based on rules obtained from the store 135. In one implementation, prioritization may be based on one or more factors including, for example:

1. How relevant the data is to the driver. For example, an update may be available that allows interoperability of the vehicle system 101 with a new cell phone, but if the cell phone is not detected as being in the vehicle, this may be a factor in prioritizing whether the notification is provided at the notification point. On the other hand, if an update is available for pairing with a cell phone the driver has and if the driver has been having problems pairing the cell phone with the vehicle system 101, this may be a factor in prioritizing whether the notification is provided at a notification point.

As another example of relevance, media and/or entertainment notifications may be relevant to a driver who spends significant (e.g., over a pre-defined or configurable threshold) time interacting with a media component. Furthermore, the amount of time a driver spends interacting with a component may be used as a factor in prioritizing whether a notification regarding the component is provided at a notification point.

2. Appointments. How far away the next appointment is may be used as a factor in prioritizing whether the notification is provided at a notification point.

3. Vehicle characteristics. Some vehicles are completely battery powered and have a limited range. Based on a current pattern and previous observed driver behavior with regard to locations typically visited, the vehicle system 101 may determine that a notification is of high priority to tell the driver that a re-charge is needed to reach locations that the vehicle system 101 predicts the driver will go based on past observed driver behavior. Similar prioritizations and notifications may occur for gas-powered and hybrid vehicles.

4. Receptivity to types of notification. As mentioned previously, a driver may be more receptive to some types of notifications than to other types of notifications. As other examples, the vehicle system 101 may observe that the driver used previously-unused shortcuts indicated in previous notifications, that the driver installed applications indicated in previous notifications, or the like. As another example, the vehicle system 101 may notice receptivity or non-receptivity via detection of stress (e.g., via skin sensors, detection of a flushed face, detection of heart rate changes, detection of eye pupil dilation, or the like). Receptivity may be used as a factor in prioritizing whether a notification is provided at a notification point.

5. Timeliness and/or location. The priority of some types of notifications may be influenced by a time of day, location of the vehicle, or the like. For example, if the vehicle is at a location far from home and obtains information about a cheese festival at that location that may be of interest to the driver, this notification may receive higher priority if the vehicle stops close to the cheese festival but low or no priority if the vehicle stops far away from the cheese festival (e.g., at home) or after the cheese festival is over. A tutorial notification, on the other hand, may be timely and be provided at home or far away from home. The vehicle system 101 may give higher priority to those notifications that are appropriate for a specific time and/or place.

Exemplary Displays

As mentioned previously, a vehicle equipped with a computer may provide many options—especially when the computer is tied into various vehicle components as described in conjunction with FIG. 1. FIGS. 2-6 are block diagrams of exemplary display pages in accordance with aspects of the subject matter described herein. By providing these examples, there is no intention to limit the types or formatting of information to the examples provided. Rather, it is to be understood that the pages are exemplary only and that in other implementations, more, fewer, or other user interface elements and data may be displayed.

In one example, the display page 200 may include areas 220-222 and other user interface elements. The page 200 may be displayed automatically if the vehicle has stopped and a point appropriate for presenting notification is occurring (as described previously). The page 200 may also be available via a menu of a display device, via voice input, or via other user input as described herein. If the page 200 is available when the vehicle is in motion, the information may be simplified or otherwise modified to avoid distracting a driver of the vehicle.

The page 200 may be one of several pages that are available and that may be navigated to via menu options, gesturing, voice commands, or other NUI navigation means.

In general, a user interface (UI) element (sometimes called a control, pane, button, or icon) may be composed of zero or more other UI elements. For example, a UI element may include zero or more other UI elements which may include zero or more other UI elements and so forth. In other examples, that the display page 200 may have more, fewer, or other UI elements which may be configured in a variety of ways without departing from the spirit or scope of the subject matter described herein.

The area 220 may, for example, display UI elements 215-219 as well as a time of day element, a temperature element, and the like. The UI elements 215-219 may, when selected, allow a user to navigate to pages where the user may receive more detailed information regarding a specific subsystem of the vehicle. For example, the UI elements 215-219 may include icons that correspond to mapping, cell phone, music, environmental control, or other subsystems.

The area 221 may include tiles 223-225, areas 226-227, and buttons 228-229. The tile 223 may display, for example, miles driven, time taken for the current trip, when the next service is due. The tile 224 may display details regarding a weather forecast for the day. The empty tile 225 may be a placeholder for an area that a user may pin a desired tile. Other information displayed in a tile may include, for example, messages, a calendar, an efficiency score, and the like.

The tiles 223-225 may rotate to display other information. The information displayed in a tile may change depending on whether the vehicle is moving or parked. The tiles 223 may be placed at other locations in the page 220 including at the top, right, bottom, or center of the area 221.

The areas 226-227 may be used to display additional content. For example, the areas 226-227 may display:

1. Whether new software updates are available for the vehicle;
2. Whether vehicle service is required. If vehicle service is required, an area may further display, for example, what vehicle service is required, how overdue the vehicle service is, what things are typically done with for the required service, a service company at which the service may be performed, an estimated cost of the service, and the like.
3. Vehicle health information. Vehicle health information may include, for example, tire pressure, engine status, fuel remaining, other health information, and the like.
4. Driving efficiency. Information may be displayed regarding efficiency of a drive and tips as to how to drive more efficiently, challenge information, tips, and the like.

Figure 6:
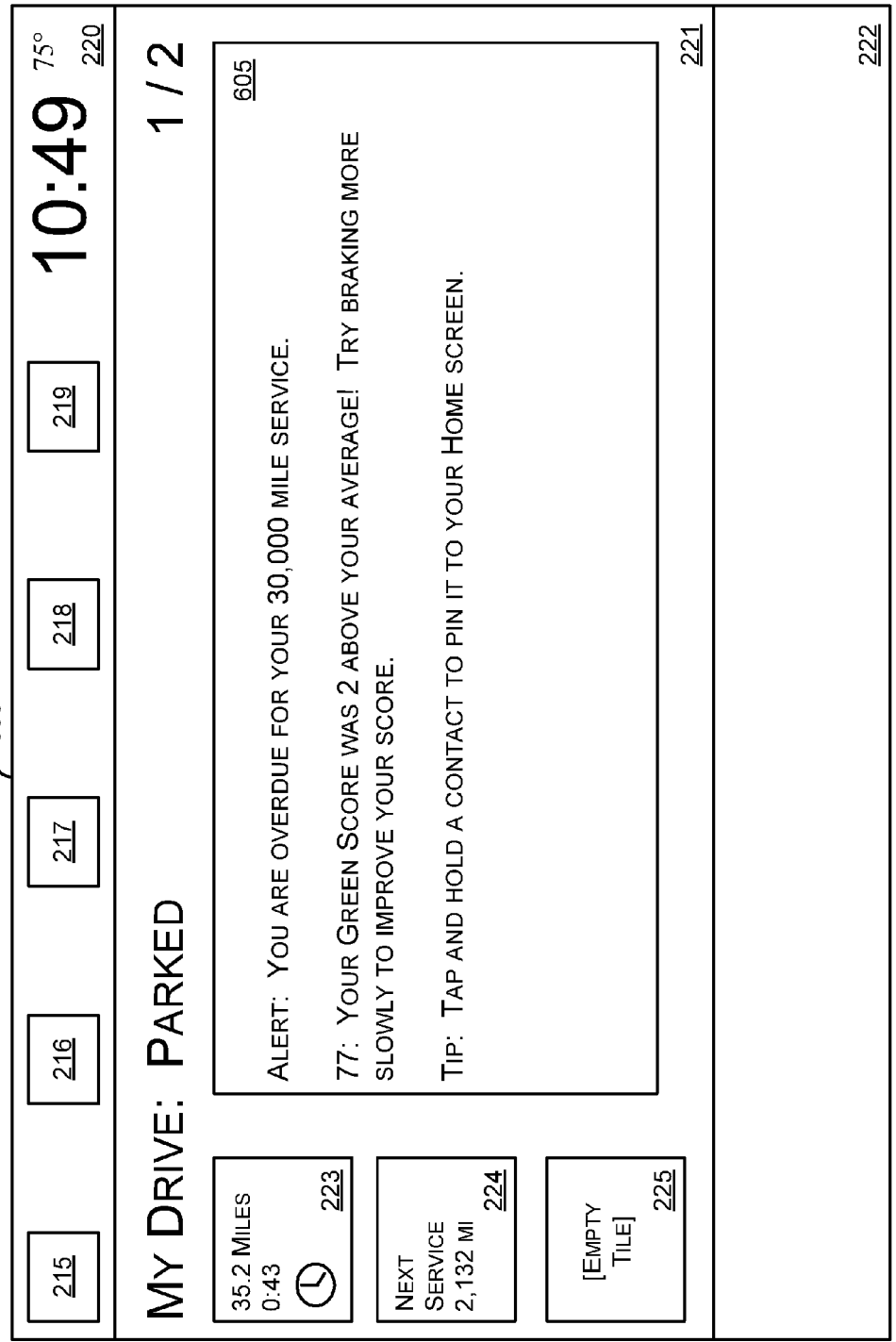

In one implementation, the areas 226-227 may be combined into a single area in which information is displayed (e.g., as a list). An example of this is illustrated in FIG. 6.

The action buttons 228-229 may allow the driver to indicate that an action is to be performed by the vehicle system 101. For example, an action may include:

1. Scheduling a service appointment.
2. Sharing a score or other information with friends.
3. Pairing a phone with the vehicle system 101.
4. Addressing an application issue (e.g., providing new credentials to logon to a service).
5. Providing a challenge (e.g., to friends in gamification).

The actions buttons 228-229 may be omitted if, for example, data displayed is informational only.

The area 222 may be used to display other UI elements as desired. In one implementation, the area 222 may show what other pages are available as well as a search icon and a configuration icon. In another implementation, the area 222 may be combined with other areas on the page 200.

Figure 3:
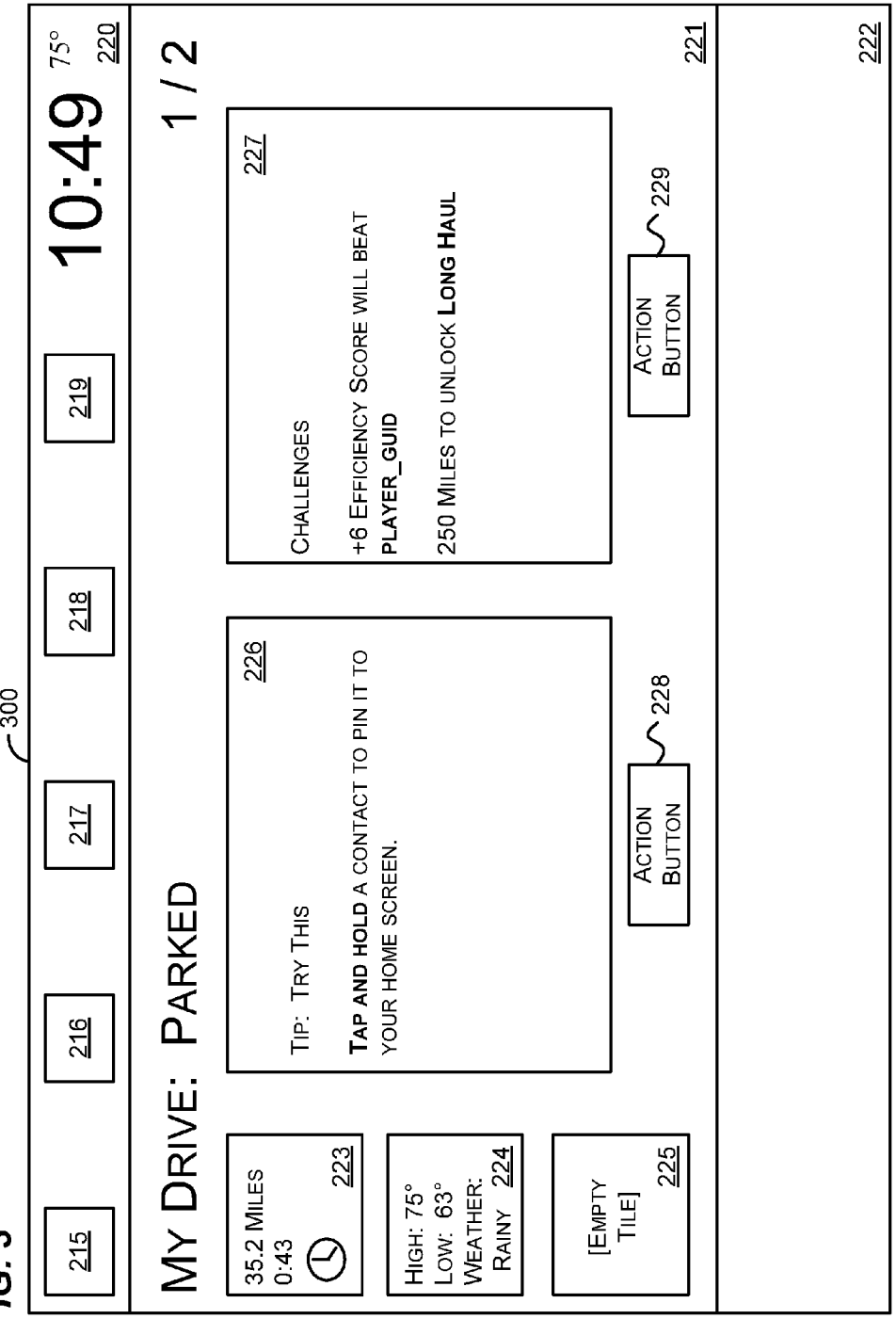

Turning to FIG. 3, the page 300 has some different information than the page 200 of FIG. 2. Specifically, the area 226 provides a tip on how to pin a contact to a home screen. In addition, the area 227 shows a challenge related to gamification.

Figure 4:
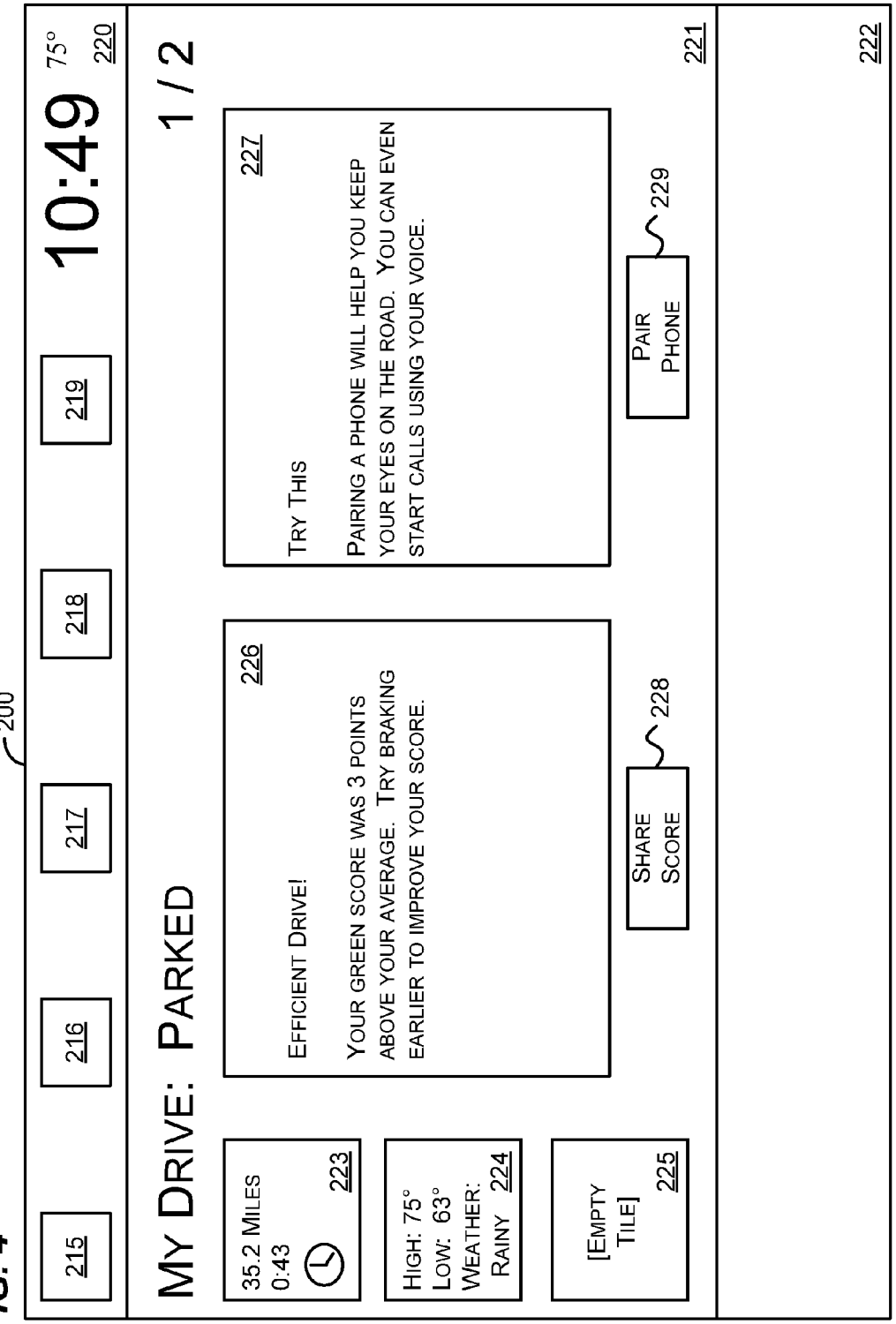

Turning to FIG. 4, the page 400 has some different information than the page 200 of FIG. 2. Specifically, the area 226 provides a notification about the efficiency of a drive together with a suggestion for improving the efficiency score. The button 228 allows the driver to share the efficiency with others.

The area 227 gives the driver a notification about an undiscovered feature (e.g., pairing a phone with the driving system) while the button 229 allows the driver to being the pairing process.

Figure 5:
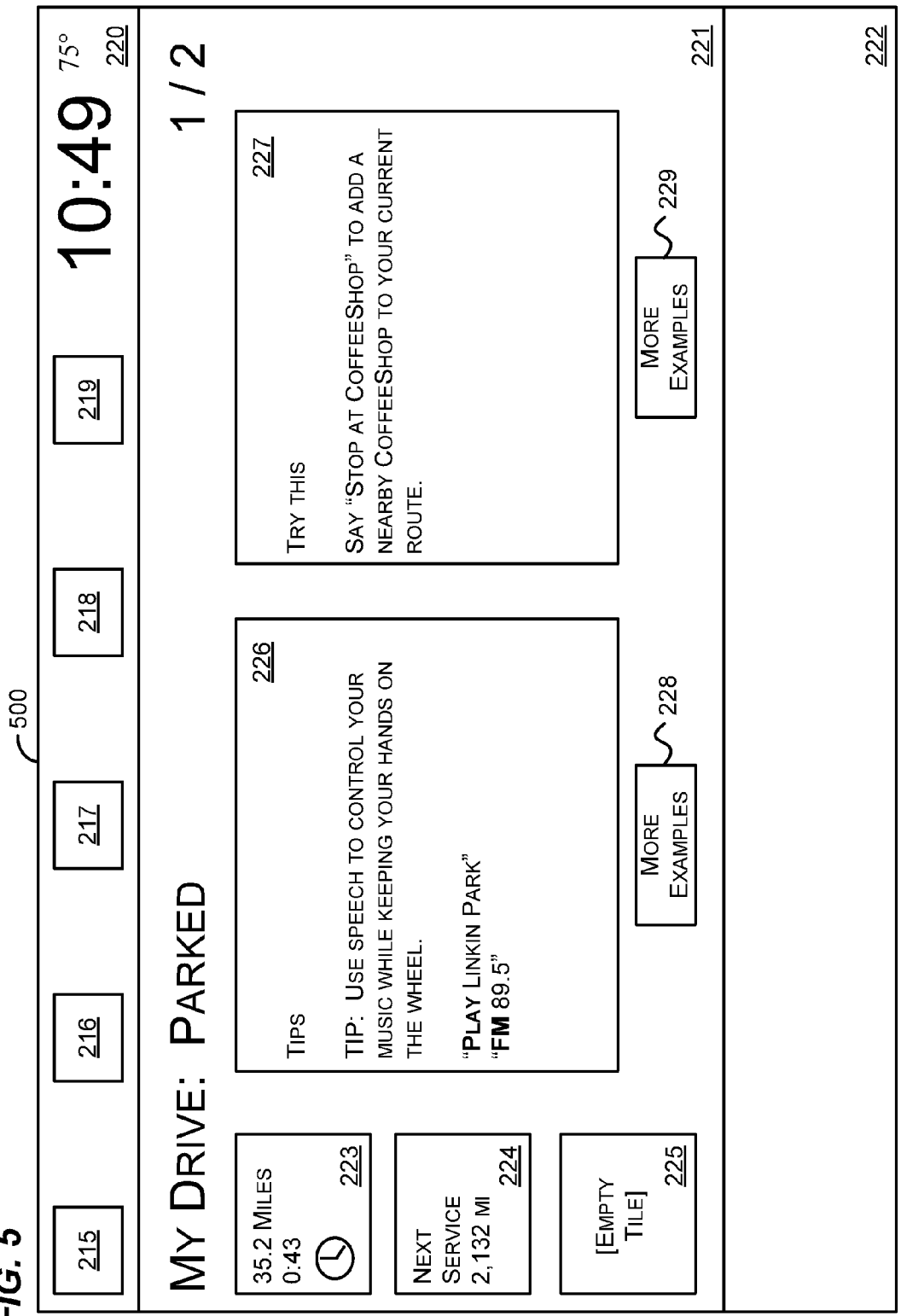

Turning to FIG. 5, the page 500 has some different information than the page 200 of FIG. 2. Specifically, the area 226 provides a notification that includes a tip regarding a voice command that allows the driver to request audio and that gives the driver some examples. The action button 228 may allow the driver to obtain more examples of speech commands.

The area 227 provides a notification that includes a tip regarding a voice command that allows the driver to add a stop point to a mapping system of the driving system. In implementation, the term "CoffeeShop" may be replaced with the trade name of a business that serves coffee or some other business that the driver often stops at. The action button 229 may allow the driver to obtain more examples of what commands can be given to the mapping system.

Turning to FIG. 6, the page 600 has some different information than the page 200 of FIG. 2. Specifically, the areas 226 and 227 have been combined to create the area 605. The area 605 shows notifications of various types that are provided in a list.

Figure 7:
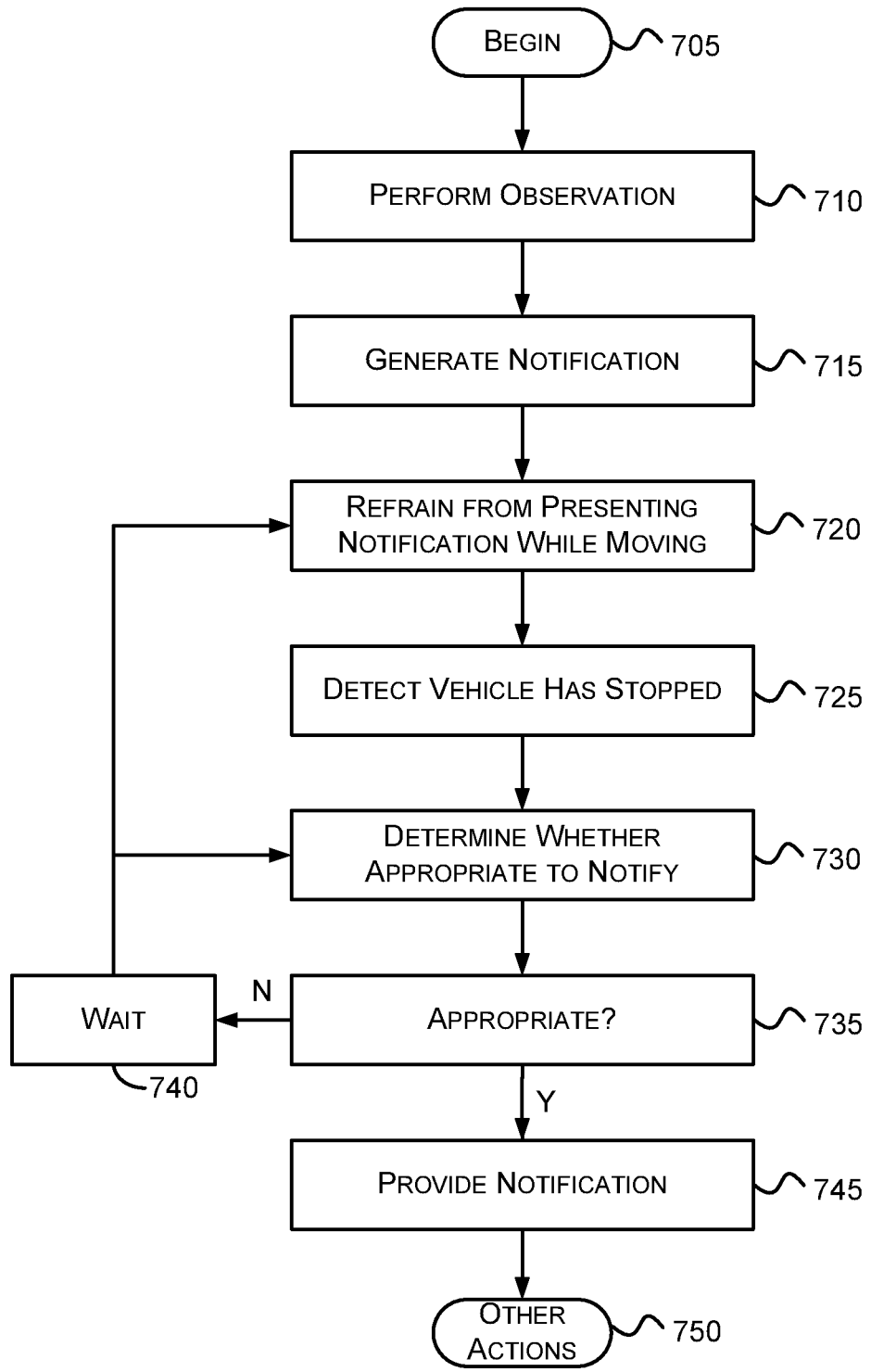
FIG. 7 is a flow diagram that generally represents exemplary actions that may occur in accordance with aspects of the subject matter described herein.

FIG. 7 is a flow diagram that generally represents exemplary actions that may occur in accordance with aspects of the subject matter described herein. For simplicity of explanation, the methodology described in conjunction with FIG. 7 is depicted and described as a series of acts. It is to be understood and appreciated that aspects of the subject matter described herein are not limited by the acts illustrated and/or by the order of acts. In one embodiment, the acts occur in an order as described below. In other embodiments, however, two or more of the acts may occur in parallel or in another order. In other embodiments, one or more of the actions may occur with other acts not presented and described herein. Furthermore, not all illustrated acts may be required to implement the methodology in accordance with aspects of the subject matter described herein. In addition, those skilled in the art will understand and appreciate that the methodology could alternatively be represented as a series of interrelated states via a state diagram or as events.

Turning to FIG. 7, at block 705, the actions begin. At block 710 an observation may be performed. For example, from data obtained from a sensor and/or input device, the processor 125 may observe a behavior of the driver, observe environmental conditions, observe status of vehicle components, or perform another observation. An observation may be made while the vehicle is moving or stopped.

At block 715, a notification may be generated. For example, referring to FIG. 1, for notifications based on driver behavior, the processor 125 may generate a notification based on an observed interaction between the driver and the vehicle 102. The notification may be generated at any time and may have been generated during a previous driving interaction with the driver. Generating a notification may include selecting a notification from a list of notifications, determining what static text and/or other graphics to combine with dynamic text and/or other graphics, creating or selecting a function that when executed will return the notification, or the like.

At block 720, in one implementation, for certain notification, the notification is not presented while the vehicle is moving. In another implementation, a simplified or modified version of the notification may be presented while the vehicle is moving. For example, referring to FIG. 1, the processor 125 refrains from presenting the notification while the vehicle 102 is in motion.

At block 725, an indication is obtained that the vehicle has stopped. There may be many different indications that the vehicle has stopped. For example, a speedometer, GPS, or other speed measuring device may be used to obtain an indication that the vehicle has stopped via a speed indication of zero. As another example, that the vehicle has been placed in park may be used as an indication that the vehicle has stopped. As another example, that the vehicle has been turned off or is in another power state may be used as an indication that the vehicle has stopped. Obtaining an indication that the vehicle has stopped may include polling components for speed data and/or receiving the indication without polling.

Furthermore, a sensor from which an indication may be obtained that the vehicle has stopped may include a speedometer, GPS, or other speed measuring device, a sensor that indicates that the vehicle is in park, a sensor that detects whether the vehicle is in park or another power state, or the like. For example, referring to FIG. 1, the processor may obtain an indication that the vehicle 102 has stopped via one or more of the sensors 105-107.

At block 730, in response to detecting that the vehicle has stopped, a determination is made as to whether a point appropriate for presenting the notification is occurring. The point is appropriate if the point satisfies a specified condition more than (e.g., in addition to) the vehicle being stopped. As described previously, determining whether a point appropriate for presenting the notification is occurring may include executing instructions that include one or more of: how long the vehicle has been stopped, whether the vehicle has been turned off, whether the vehicle has been placed in park, how long the vehicle has been placed in park, where the vehicle is located, what time it is, proximity of the vehicle to a friend of the individual, data regarding receptivity of notifications for people who live in a region where the vehicle is located, historical data relating to how long vehicles remain stopped in a location at which the vehicle has stopped, what percentage of time the vehicle spends in a location at which the vehicle has stopped, and what type of vehicle the vehicle is.

For example, referring to FIG. 1, the processor 125 may determine that a point appropriate for presenting the notification is occurring if:

1. The vehicle 102 has stopped; and
2. The vehicle 102 has been stopped for at least a period of a pre-defined threshold (e.g., longer than X seconds).

When the phrase "include one or more of" is used, this means that the condition involves at least one of the items mentioned in the list following that phrase and that the condition may also involve other items not mentioned in the list.

For example, referring to FIG. 1, the processor 125 may determine that a point appropriate for presenting the notification is occurring if:

1. The vehicle 102 has stopped;
2. The vehicle 102 has been placed in park for at least a period of a pre-defined threshold; and
3. Another condition (not mentioned in the list) has been met.

At block 735, if notification is appropriate the actions continue at block 740; otherwise, the actions continue at block 745.

At block 740, waiting occurs. For example, referring to FIG. 1, if the processor 125 determines that a notification point is not yet appropriate (e.g., based on the current conditions), the processor 125 may wait. After waiting, the actions may continue at any of the blocks of FIG. 7, but blocks 720 and block 730 are the ones illustrated. For example, the vehicle 102 may begin moving again in which case, the actions associated with block 720 are performed. As another example, after waiting, the processor 125 may again determine whether notification is appropriate as described in conjunction with block 730.

At block 745, the notification is provided. For example, referring to FIG. 1, the processor 125 may cause the output manager 130 to display the notification via the display 116 or one of the other output components.

At block 750, other actions if any, may be performed. For example, other actions may include:

1. Prioritizing presenting the notification based on observed previous receptivity of the individual to similar notifications;
2. Providing gamification feedback to the user regarding fuel efficiency, the gamification feedback based on the observed interaction between an individual and the vehicle, the gamification feedback indicating an action the individual is advised to take to improve the fuel efficiency;
3. Provides information regarding a feature of the vehicle that is available via an interaction other than the observed interaction between the individual and the vehicle;
4. Providing a speech command that has an equivalent result to a result obtained via the observed interaction between the individual and the vehicle;
5. Observing that the individual has been unsuccessful in pairing a cell phone with the vehicle, determining that an update of pairing software is available, and providing an indication of the update together with a user interface element that, if selected, initiates pairing of the cell phone using the pairing software as updated; and
6. Any other action indicated herein.

As can be seen from the foregoing detailed description, aspects have been described related to vehicle notifications. While aspects of the subject matter described herein are susceptible to various modifications and alternative constructions, certain illustrated embodiments thereof are shown in the drawings and have been described above in detail. It should be understood, however, that there is no intention to limit aspects of the claimed subject matter to the specific forms disclosed, but on the contrary, the intention is to cover all modifications, alternative constructions, and equivalents falling within the spirit and scope of various aspects of the subject matter described herein.

What is claimed is:

1. A method implemented at least in part by a processor of a vehicle, the method comprising:
   while the vehicle is in motion, refraining from presenting a notification, the notification based on an observed interaction between an individual and the vehicle;
   obtaining an indication that the vehicle has stopped;
   determining whether a point appropriate for presenting the notification is occurring, the point satisfying a condition in addition to the vehicle being stopped; and
   if the point appropriate for presenting the notification is occurring, presenting the notification.

2. The method of claim 1, wherein determining whether a point appropriate for presenting the notification is occurring comprises determining that the vehicle has been stopped for at least a period of a pre-defined threshold.

3. The method of claim 1, wherein determining whether a point appropriate for presenting the notification is occurring comprises determining that the vehicle has been placed in park for at least a period of a pre-defined threshold.

4. The method of claim 1, wherein determining whether a point appropriate for presenting the notification is occurring comprises determining whether the point satisfies the condition by a processor executing instructions that include one or more of: how long the vehicle has been stopped, whether the vehicle has been turned off, whether the vehicle has been placed in park, how long the vehicle has been placed in park, where the vehicle is located, what time it is, proximity of the vehicle to a friend of the individual, data regarding receptivity of notifications for people who live in a region where the vehicle is located, historical data relating to how long vehicles remain stopped in a location at which the vehicle has stopped, what percentage of time the vehicle spends in a location at which the vehicle has stopped, or what type of vehicle the vehicle is.

5. The method of claim 1, further comprising prioritizing presenting the notification based on observed previous receptivity of the individual to similar notifications.

6. The method of claim 1, wherein presenting the notification comprises providing gamification feedback to the user regarding safety, the gamification feedback based on the observed interaction between the individual and the vehicle, the gamification feedback indicating an action the individual is advised to take to improve the safety.

7. The method of claim 1, wherein the notification provides information regarding a feature of the vehicle that is available via an interaction other than the observed interaction between the individual and the vehicle.

8. The method of claim 7, wherein presenting the notification comprises providing a speech command that has an equivalent result to a result obtained via the observed interaction between the individual and the vehicle.

9. The method of claim 1, further comprising observing that the individual has been unsuccessful in pairing a cell phone with the vehicle, determining that an update of pairing software is available, and wherein presenting the notification comprises providing an indication of the update together with a user interface element that, if selected, initiates pairing of the cell phone using the pairing software as updated.

10. In a vehicle, a system, comprising:
a sensor for indicating that the vehicle has stopped;
an input device for receiving input from an individual who interacts with the vehicle;
an output device for providing output to the individual;
a processor coupled to the sensor, the input device, and the output device, the processor structured to respond to the sensor indicating that the vehicle has stopped by determining whether a point appropriate for presenting a notification is occurring, the point satisfying a condition in addition to the vehicle being stopped, the processor further structured to present the notification to the individual via the output device if the point appropriate for presenting the notification is occurring.

11. The system of claim 10, wherein the input device comprises a touch screen that is structured to receive touch input from the individual, the touch screen further configured to act as the output device for providing output to the individual.

12. The system of claim 10, wherein the input device comprises a microphone that is structured to receive audio input from the individual.

13. The system of claim 10, wherein the input device comprises a jog dial that is structured to receive input from the individual.

14. The system of claim 10, wherein the processor being structured to determine whether a point appropriate for presenting a notification is occurring comprises the processor being structured to evaluate whether the condition is satisfied, the condition including one or more of: how long the vehicle has been stopped, whether the vehicle has been turned off, whether the vehicle has been placed in park, how long the vehicle has been in park, where the vehicle is located, what time it is, proximity to a friend, data specific to people who live in a region in which the vehicle is, historical data relating to how long vehicles remain stopped in a location at which the vehicle has stopped, whether the vehicle spends a significant amount of time at a location at which the vehicle has stopped, or what type of vehicle the vehicle is.

15. The system of claim 10, wherein the processor is further structured to receive data from another sensor or the input device and to determine therefrom a behavior of the individual, the processor further structured to generate the notification based on the behavior.

16. The system of claim 15, wherein the processor being structured to generate the notification based on the behavior comprises the processor being structured to generate output that teaches the driver about a feature of the vehicle that the driver did not used as demonstrated by the behavior.

17. The system of claim 16, wherein the processor being structured to generate output that teaches the driver about a feature of the vehicle that the driver did not use as demonstrated by the behavior comprises the processing being structured to provide a speech command equivalent to one or more actions taken by the driver.

18. The system of claim 15, wherein the processor being structured to generate the notification based on the behavior comprises the processor being structured to generate the notification based on receptivity of the individual to previous notifications having a similar characteristic to the notification.

19. The system of claim 10, wherein the processor is further structured to determine the notification based on a number of people in the vehicle and identities of the people.

20. A vehicle, comprising:
a display for displaying notifications to an individual;
a sensor for indicating that the vehicle has stopped;
a storage for storing executable instructions for generating the notifications; and
a processor coupled to the display, the sensor, and the storage, the processor structured to respond to the sensor indicating that the vehicle has stopped by being structured to determine whether the vehicle is at a point appropriate for presenting a notification to the individual, the point satisfying a condition in addition to the vehicle being stopped.

* * * * *